United States Patent
Kim et al.

(10) Patent No.: US 7,026,881 B2
(45) Date of Patent: Apr. 11, 2006

(54) WIDEBAND VARIABLE FREQUENCY VOLTAGE CONTROLLED OSCILLATOR

(75) Inventors: Yong Hak Kim, Gunpo-shi (KR); Chul Soon Park, Daejeon (KR)

(73) Assignee: Information and Communications University Educational Foundation, Seoul (KR)

( * ) Notice: Subject to any disclaimer, the term of this patent is extended or adjusted under 35 U.S.C. 154(b) by 53 days.

(21) Appl. No.: 10/755,294

(22) Filed: Jan. 13, 2004

(65) Prior Publication Data

US 2005/0001691 A1 Jan. 6, 2005

(30) Foreign Application Priority Data

Jul. 1, 2003 (KR) .................... 10-2003-0044227

(51) Int. Cl.
*H03B 5/00* (2006.01)

(52) U.S. Cl. ............................ 331/117 R; 331/177 V; 331/36 C; 331/74; 331/167

(58) Field of Classification Search ............ 331/117 R, 331/177 V, 36 C, 74, 167
See application file for complete search history.

(56) References Cited

U.S. PATENT DOCUMENTS 6,218,909 B1 * 4/2001 Eban ..................... 331/117 R
6,859,112 B1 * 2/2005 Mason ................. 331/117 FE

* cited by examiner

*Primary Examiner*—Arnold Kinkead
(74) *Attorney, Agent, or Firm*—Bacon & Thomas, PLLC

(57) ABSTRACT

In a wideband variable frequency voltage controlled oscillator, an LC resonance circuit determines an oscillation frequency based on an externally inputted voltage signal. A negative resistance generating circuit generates a signal having the oscillation frequency determined by the LC resonance circuit. A buffer circuit transfers the oscillation frequency generated by the negative resistance generating circuit to a load. A variable capacitor connecting circuit connects the negative resistance generating circuit and the buffer circuit to transfer the signal having the oscillation frequency from the negative resistance generating circuit to the buffer circuit.

8 Claims, 6 Drawing Sheets

WIDEBAND VARIABLE FREQUENCY VOLTAGE CONTROLLED OSCILLATOR

FIELD OF THE INVENTION

The present invention relates to a wideband variable frequency voltage controlled oscillator for a mobile communication system; and, more particularly, to the wideband variable frequency voltage controlled oscillator of the mobile communication system, which is able to achieve a high integration thereof by adopting a variable capacitor connecting circuit.

BACKGROUND OF THE INVENTION

A conventional voltage controlled oscillator is one of the important devices that have been widely used in a communication system. Especially, an LC voltage controlled oscillator is an indispensable device in a recent wireless mobile communication because of its original characteristics of low noise. FIG. 1 shows a circuit of the conventional LC differential voltage controlled oscillator.

In a recent wireless mobile communication field, especially, in a next generation of a second generation thereof, a voltage controlled oscillator that is usable in a wide bandwidth and a multiple bandwidth is required. A conventional method for expanding a bandwidth of a voltage controlled oscillator includes a method using a Yttrium Iron Garnet (YIG)-tuned oscillator, a method using a switching device including multiple inductors or capacitors, a method using an off-chip variable capacitor that operates with a high voltage applied thereto, and the like.

However, the YIG-tuned oscillator capable of being used in a wide bandwidth requires a high voltage and is not appropriate for a wireless mobile communication terminal due to a considerably large size of a circuit.

Further, the method using a switching device including multiple inductors or capacitors has a problem in that multiple inductors are inserted in one chip or multiple input signals are needed to control the switching device. And, in case of the method using an off-chip variable capacitor, a high voltage is required and, particularly, a high integration thereof is difficult to achieve.

SUMMARY OF THE INVENTION

It is, therefore, an object of the present invention to provide a wideband variable frequency voltage controlled oscillator for a mobile communication system, which is able to achieve a high integration thereof by adopting a simple capacitor connecting circuit.

In accordance with a preferred embodiment of the present invention, there is provided a wideband variable frequency voltage controlled oscillator comprising: an LC resonance circuit for determining an oscillation frequency based on an externally inputted voltage signal; a negative resistance generating circuit for generating a signal having an oscillation frequency determined by the LC resonance circuit; a buffer circuit for transferring the signal having the oscillation frequency generated by the negative resistance generating circuit to a load; and a variable capacitor connecting circuit for connecting the negative resistance generating circuit and the buffer circuit to transfer the signal having the oscillation frequency from the negative resistance generating circuit to the buffer circuit.

In accordance with another preferred embodiment of the present invention, there is provided a Colpitts wideband variable frequency voltage controlled oscillator comprising: an LC resonance circuit for determining an oscillation frequency based on an externally inputted voltage signal; a negative resistance generating circuit for generating a signal having the oscillation frequency determined by the LC resonance circuit; and a variable capacitor connecting circuit for connecting the LC resonance circuit and the negative resistance generating circuit.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENTS

Hereinafter, preferred embodiments of the present invention will be described in detail with reference to the accompanying drawings.

Figure 2:
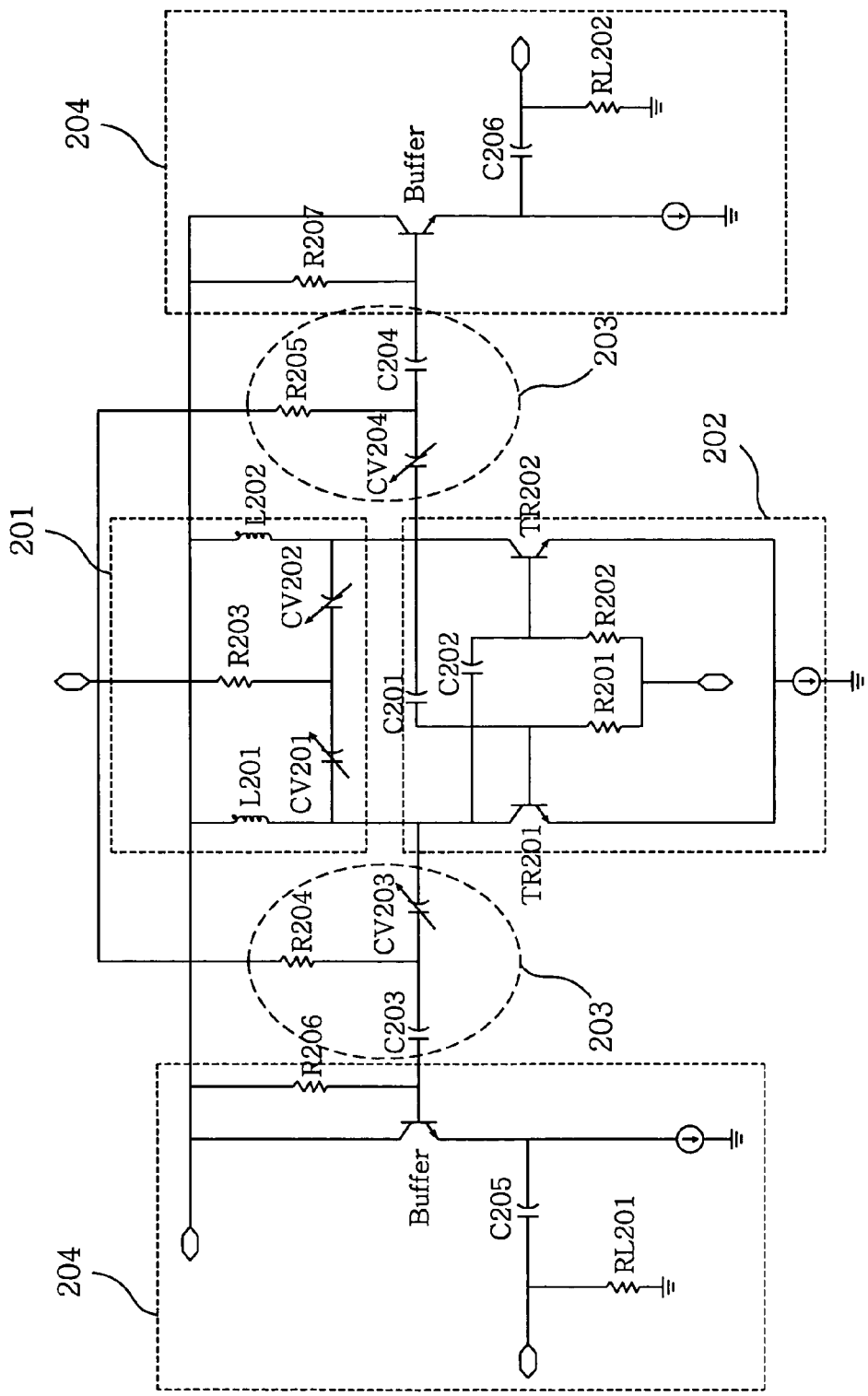
FIG. 2 illustrates a circuit diagram of an LC differential voltage controlled oscillator in accordance with a preferred embodiment of the present invention.

FIG. 2 illustrates a circuit diagram of an LC differential voltage controlled oscillator in accordance with a preferred embodiment of the present invention. As can be seen from FIG. 2, a circuit of the present invention is composed of an LC-resonance circuit 201, a negative resistance generating circuit 202, a buffer circuit 204, and a variable capacitor connecting circuit 203 for connecting the negative resistance generating circuit 202 and the buffer circuit unit 204.

Figure 1:
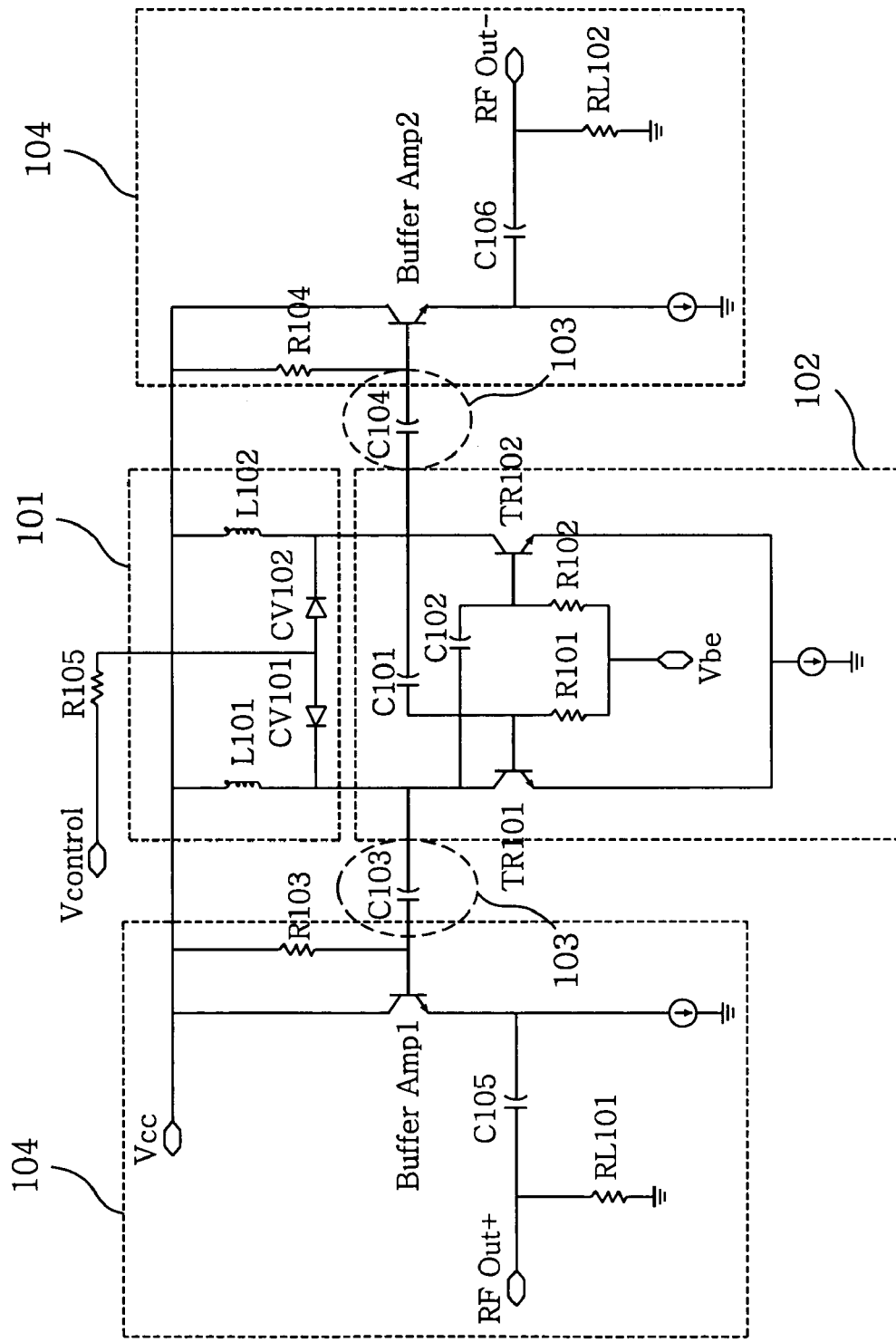
FIG. 1 shows a circuit diagram of a conventional LC differential voltage controlled oscillator.

Especially, as can be understood by comparing of FIGS. 1 and 2, the variable capacitor connecting circuit 203 is connected to a portion where a conventional capacitor connecting circuit 103 is connected in FIG. 1, in order to expand a frequency bandwidth. In other words, by using a simple variable capacitor circuit, e.g., the variable capacitor connecting circuit 203, it is possible to considerably expand the variable frequency bandwidth of the LC differential voltage controlled oscillator.

Figure 3:
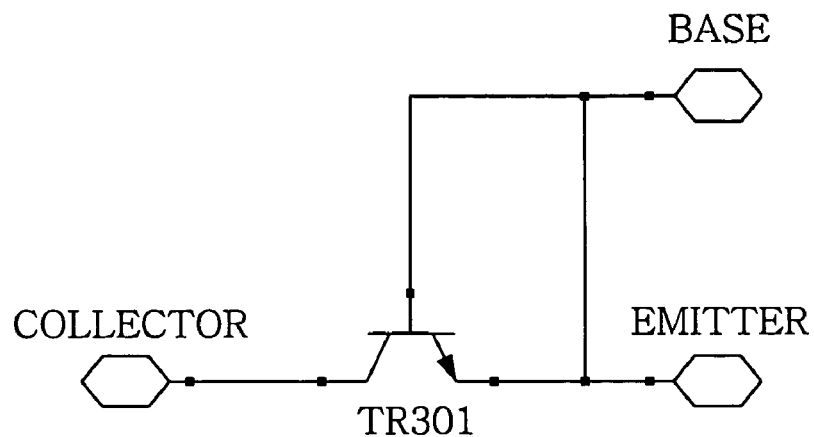
FIG. 3 depicts an exemplary circuit diagram of a variable capacitor in accordance with a preferred embodiment of the present invention.

FIG. 3 depicts a specific circuit diagram of the variable capacitor connecting circuit. As illustrated in FIG. 3, the variable capacitor circuit 203 implements a variable capacitance by applying a reverse voltage to a P-N junction between a base and a collector of a transistor TR301 or between the base and an emitter thereof, to thereby increase an integration ratio in one chip. The P-N junction may be realized by a bipolar junction transistor or an Schottky P-N junction.

A method for analyzing the LC voltage controlled oscillator of FIG. 2 in accordance with the present invention includes a feedback method and a negative resistance method. Hereinafter, an analysis using the negative resistance method will be described.

Figure 4:
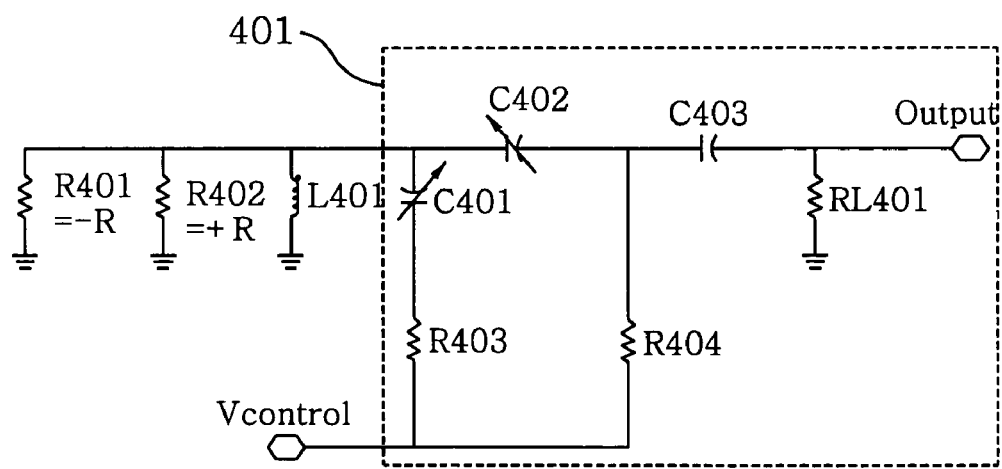
FIG. 4 describes a circuit diagram of a small signal-equivalent model of the voltage controlled oscillator of FIG. 2.

FIG. 4 describes a small signal equivalent model of the LC voltage controlled oscillator illustrated in FIG. 2 in accordance with the present invention. An operating principal and method of the LC voltage controlled oscillator will be described with reference to FIG. 4. First, an oscillation frequency is as follow:

$$\text{oscillation frequency}(\omega) = \frac{1}{\sqrt{LC}} \quad \text{Eq. 1}$$

As illustrated in FIGS. 2 and 4, the negative resistance generating circuit 202 generates a negative resistance −R R401 and the resonance circuit 201 determines a resistance +R R402 corresponding to the negative resistance.

Figure 5:
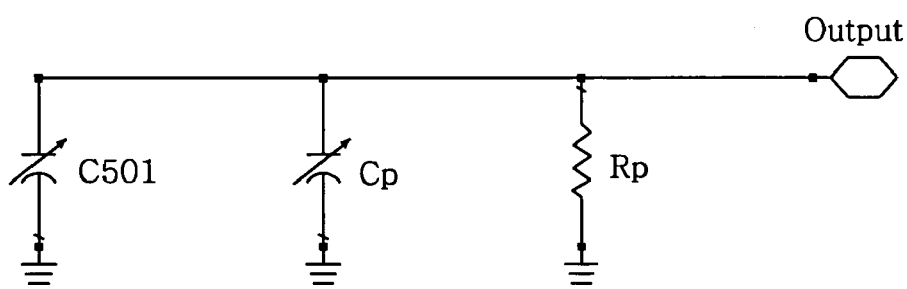
FIG. 5 provides a circuit diagram of a small signal-equivalent model of a negative resistance generating circuit of FIG. 4.

FIG. 5 depicts a small signal equivalent model of a variable capacitor circuit 401 of FIG. 4, for determining frequency characteristics.

At this time, each value of variables of the equivalent model in FIG. 5 is obtained as follows:

$$X_s = \frac{1}{\omega(C402 \,//\, C403)} \quad \text{Eq. 2}$$

$$X_p = \frac{RL401^2 + X_s^2}{X_s} \quad \text{Eq. 3}$$

$$R_p = \frac{RL401^2 + X_s^2}{RL401} \quad \text{Eq. 4}$$

Herein, a capacitance of the capacitor provides a certain amount of capacitance in the voltage controlled oscillator in accordance with the present invention and the amount of the capacitance is obtained as follow:

$$C_p = \frac{1}{\omega \cdot X_p} \quad \text{Eq. 5}$$

Therefore, the oscillation frequency is determined depending on variation limits of variable capacitors CV201 and CV202 and $C_p$ shown in Eq. 5.

More specifically, though the oscillator in accordance with the present invention uses variable capacitors CV203 and CV204, the variation limits of the variable capacitors CV201 and CV202 in the resonance circuit 201 are not changed. However, when the oscillator generates a maximum frequency, the variable capacitors CV201 and CV202 have a smallest capacitance and the variable capacitors CV203 and CV204 of a connecting circuit also have a smallest capacitance. On the other hand, when the oscillator generates a minimum frequency, the variable capacitors CV201 and CV202 have a maximum capacitance. And also, the variable capacitors CV203 and CV204 of the connecting circuit have a maximum capacitance. From a point of view of an overall circuit, the oscillator of the present invention has a greater capacitance variation range than a general capacitor connecting circuit has, so that an oscillation frequency bandwidth can be expanded.

Figure 6:
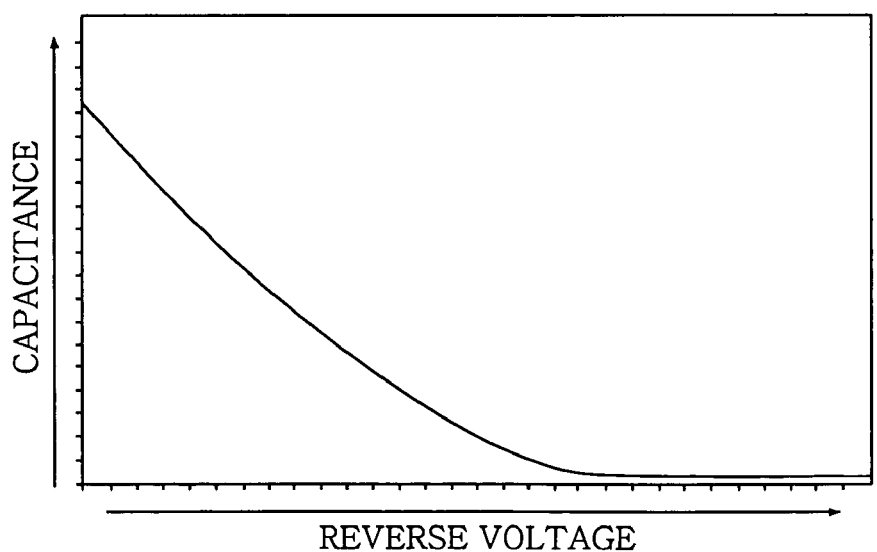
FIG. 6 presents an exemplary graph for showing a variation of a capacitance of a variable capacitor in accordance with a preferred embodiment of the present invention.

The variable capacitor 203 of the present invention utilizes a capacitance between a base and a collector of a transistor, as shown in FIG. 3. In this case, a variation of the capacitance in accordance with a reverse voltage applied to a P-N junction is described in FIG. 6. As shown in FIG. 6, the capacitance decreases as the reverse voltage applied to the P-N junction increases. Further, the variable capacitors CV201, CV202, CV203, and CV204 illustrated in the circuit of FIG. 2 react to the reverse voltage applied to the P-N junction.

Figure 7:
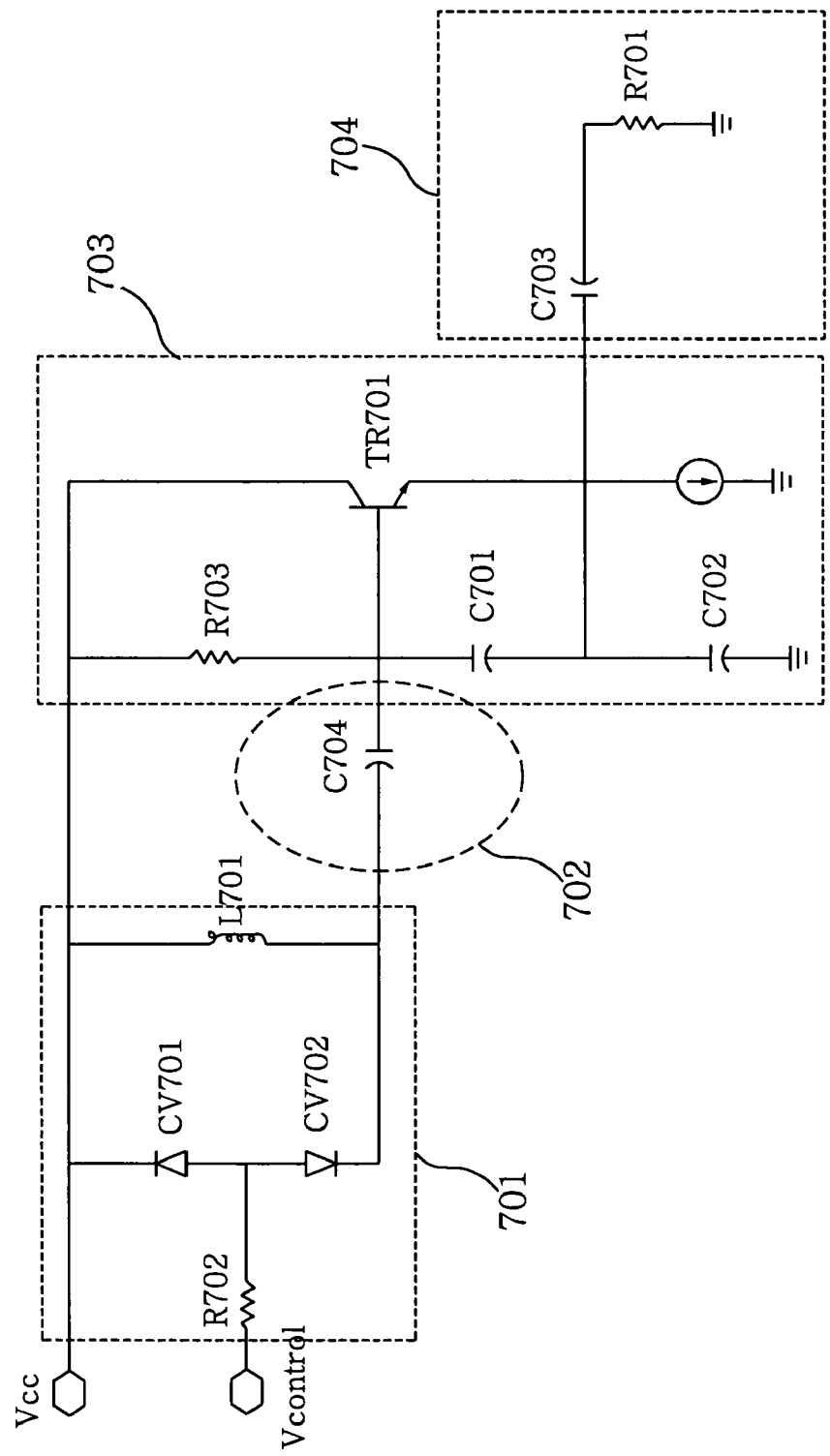
FIG. 7 represents a circuit diagram of a conventional Colpitts voltage controlled oscillator.
Figure 8:
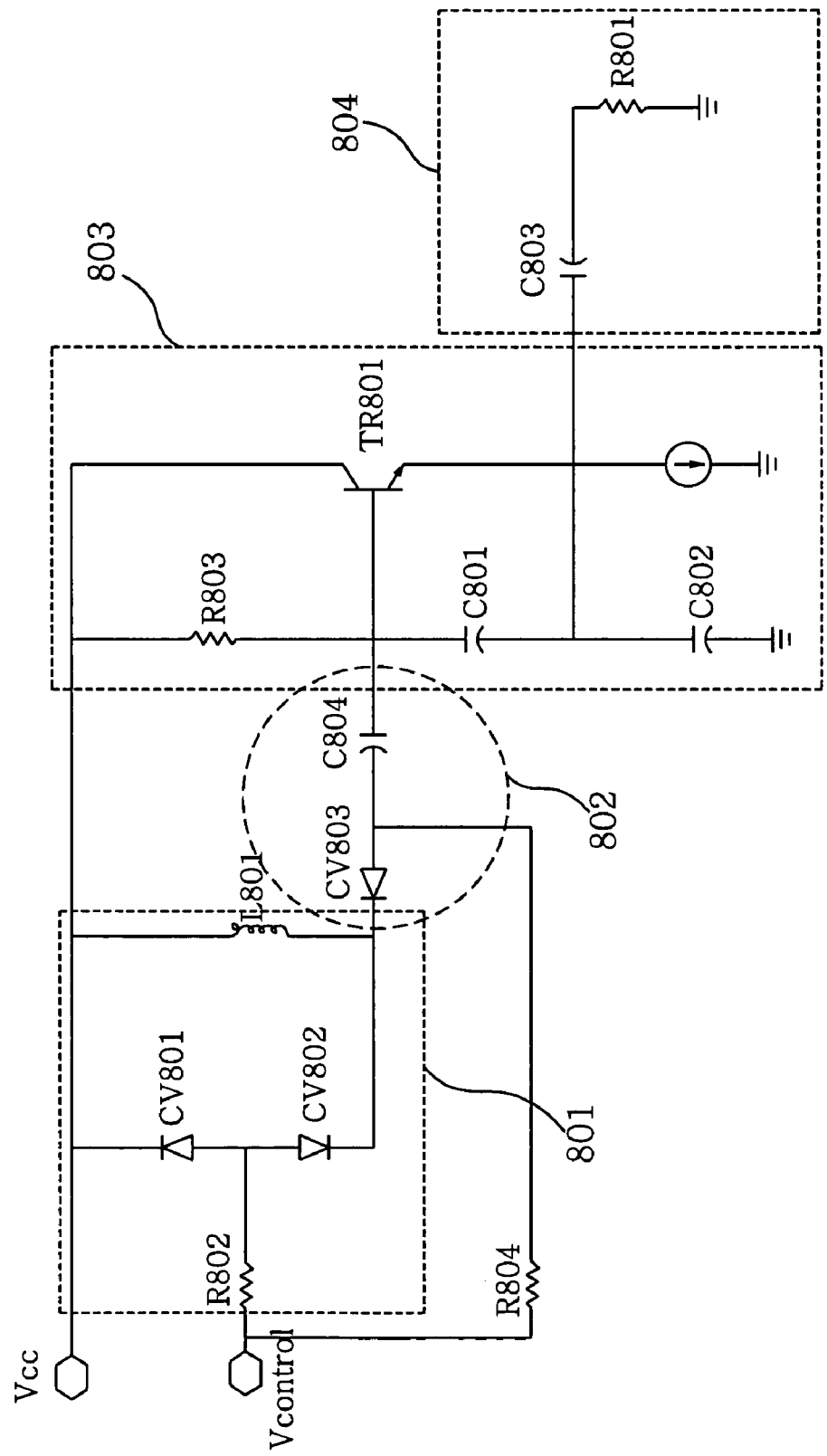
FIG. 8 offers a circuit diagram of a Colpitts voltage controlled oscillator in accordance with another preferred embodiment of the present invention.

FIG. 8 depicts a voltage controlled oscillation circuit in accordance with a preferred embodiment of the present invention, which corresponds to a conventional Colpitts voltage controlled oscillator illustrated in FIG. 7. Unlike a general capacitor connecting circuit of FIG. 7, a capacitor connecting circuit 802 of FIG. 8 is connected to a variable capacitor CV803. Therefore, as in the voltage controlled oscillator of FIG. 2 in accordance with another preferred embodiment of the present invention, the capacitor connecting circuit 802 provides the greater capacitance variation range than the general capacitor connecting circuit, thereby expanding a bandwidth of the oscillation frequency. At this time, a circuit of a Colpitts voltage controlled oscillator of FIG. 8 can be equally analyzed as in that of the LC-differential voltage controlled oscillator of FIG. 2.

While a conventional voltage controlled oscillator has difficulties in achieving miniaturization, integration, and minimization thereof, as described above, the voltage controlled oscillator in accordance with the present invention can be used for implementing a microwave monolithic integrated circuit (MMIC) by employing a simple variable capacitor circuit for expanding a frequency bandwidth of a voltage controlled oscillator without adding additional input signals or changing a size of a circuit.

While the invention has been shown and described with respect to the preferred embodiments, it will be understood by those skilled in the art that various changes and modifications may be made without departing from the spirit and scope of the invention as defined in the following claims.

What is claimed is:

1. A wideband variable frequency voltage controlled oscillator comprising:
   an LC resonance circuit for determining an oscillation frequency based on an externally inputted voltage signal;
   a negative resistance generating circuit for generating a signal having the oscillation frequency determined by the LC resonance circuit;
   a buffer circuit for transferring the signal having the oscillation frequency generated by the negative resistance generating circuit to a load; and
   a variable capacitor connecting circuit for connecting the negative resistance generating circuit and the buffer circuit to transfer the signal having the oscillation frequency from the negative resistance generating circuit to the buffer circuit,
   wherein the variable capacitor connecting circuit is variably controlled to have a smallest capacitance and a largest capacitance when the oscillation frequency reaches a maximum frequency and a minimum frequency in the oscillation circuit, respectively, thereby increasing a capacitance variation range which determines an oscillation frequency bandwidth.

2. The oscillator of claim 1, wherein the variable capacitor connecting circuit implements a variable capacitance depending on a reverse voltage applied to a P-N junction between a base and a collector in a bipolar junction transistor.

3. The oscillator of claim 1, wherein the variable capacitor connecting circuit implements a variable capacitance depending on a reverse voltage applied a to a P-N junction between a base and an emitter in a bipolar junction transistor.

4. The oscillator of claim 1, wherein the variable capacitor connecting circuit implements a variable capacitance depending on a reverse voltage applied a to a Schottky P-N junction.

5. A Colpitts wideband variable frequency voltage controlled oscillator comprising:
- an LC resonance circuit for determining an oscillation frequency based on an externally inputted voltage signal;
- a negative resistance generating circuit for generating the oscillation frequency determined by the LC resonance circuit; and
- a variable capacitor connecting circuit for connecting the LC resonance circuit and the negative resistance generating circuit, wherein the variable capacitor connecting circuit is variably controlled to have a smallest capacitance and a largest capacitance when the oscillation frequency reaches a maximum frequency and a minimum frequency in the oscillation circuit, respectively, thereby increasing a capacitance variation range which determines an oscillation frequency bandwidth.

6. The oscillator of claim 5, wherein the variable capacitor connecting circuit implements a variable capacitance depending on a reverse voltage applied a to a P-N junction between a base and a collector in a bipolar junction transistor.

7. The oscillator of claim 5, wherein the variable capacitor connecting circuit implements a variable capacitance depending on a reverse voltage applied a to a P-N junction between a base and an emitter in a bipolar junction transistor.

8. The oscillator of claim 5, wherein the variable capacitor connecting circuit implements a variable capacitance depending on a reverse voltage applied a to a Schottky P-N junction.

* * * * *